US006573202B2

(12) United States Patent
Ivanov et al.

(10) Patent No.: US 6,573,202 B2
(45) Date of Patent: Jun. 3, 2003

(54) FOUR-TERMINAL SYSTEM FOR READING THE STATE OF A PHASE QUBIT

(75) Inventors: Zdravko Ivanov, Göteborg (SE); Alexander Tzalentchuk, Göteborg (SE); Jeremy P. Hilton, Van. (CA); Alexander Maassen van den Brink, Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 0 days.

(21) Appl. No.: 10/155,746

(22) Filed: May 24, 2002

(65) Prior Publication Data

US 2003/0057441 A1 Mar. 27, 2003

Related U.S. Application Data

(62) Division of application No. 09/875,776, filed on Jun. 5, 2001.

(51) Int. Cl.[7] .............................................. H01L 21/00
(52) U.S. Cl. ........................ 438/962; 257/14; 257/22; 257/31; 257/33; 257/421
(58) Field of Search .............................. 257/14, 31, 33, 257/22, 421

(56) References Cited

U.S. PATENT DOCUMENTS

| 5,323,344 | A | | 6/1994 | Katayama et al. | |
|---|---|---|---|---|---|
| 5,869,846 | A | * | 2/1999 | Higashino et al. | 257/31 |
| 5,917,322 | A | | 6/1999 | Gershenfeld et al. | |
| 6,157,044 | A | * | 12/2000 | Nakanishi et al. | 257/33 |
| 6,459,097 | B1 | | 10/2002 | Zagoskin | |
| 2001/0020701 | A1 | | 9/2001 | Zagoskin | |
| 2001/0023943 | A1 | | 9/2001 | Zagoskin | |

OTHER PUBLICATIONS

L. Alff, B. Mayer, S. Schuster, O. Froöhlich, R. Gerdemann, A. Beck, and R. Gross, "Magnetic–field–effect three–terminal device based on $YBa_2Cu_3O_{7-x}$ grain boundary junctions", Journal of Applied Physics, 75, pp. 1843–1845 (1994).

Steven M. Anlage, D. E. Steinhauer, C. P. Vlahacos, B. J. Feenstra, A. S. Thanawalla, Wensheng Hu, Sudeep K. Dutta, and F. C. Wellstood, "Superconducting Material Diagnostic using a Scanning Near–Field Microwave Microscope", Los Alamos National Laboratory preprint cond–mat/9811158, pp. 1–6, (1998), access via http://www.arXiv.org, last accessed Nov. 15, 2002.

M. R. Beasley, D. Lew, and R. B. Laughlin, "Time–reversal symmetry breaking in superconductors: A proposed experimental test", Physical Review B, 49, pp. 12330–12332 (1994).

(List continued on next page.)

*Primary Examiner*—Hoai Ho
*Assistant Examiner*—Mai-Huong Tran
(74) *Attorney, Agent, or Firm*—Pennie & Edmonds LLP

(57) ABSTRACT

Quantum computing systems and methods that use opposite magnetic moment states read the state of a qubit by applying current through the qubit and measuring a Hall effect voltage across the width of the current. For reading, the qubit is grounded to freeze the magnetic moment state, and the applied current is limited to pulses incapable of flipping the magnetic moment. Measurement of the Hall effect voltage can be achieved with an electrode system that is capacitively coupled to the qubit. An insulator or tunnel barrier isolates the electrode system from the qubit during quantum computing. The electrode system can include a pair of electrodes for each qubit. A readout control system uses a voltmeter or other measurement device that connects to the electrode system, a current source, and grounding circuits. For a multi-qubit system, selection logic can select which qubit or qubits are read.

13 Claims, 9 Drawing Sheets

OTHER PUBLICATIONS

A. Blais, and A. Zagoskin, "Operation of universal gates in a solid–state quantum computer based on clean Josephson junctions between d–wave superconductors", Physical Review A, 61, 042308 (2000).

G. Blatter, V.B. Geshkenbein, and L. Ioffe, "Engineering Superconductor Phase Qubits", Los Alamos National Laboratory preprint cond–mat/9912163, pp. 1–8, (1999), access via http://www.arXiv.org, last accessed Nov. 15, 2002.

J. Chen, T. Yamashita, H. Sasahara, H. Suzuki, H. Kurosawa, and Y. Hirotsu, "Possible three–terminal device with YBCO angle grain boundary", IEEE Transactions on Applied Superconductivity, 1, pp. 102–107 (1991).

C. Doughty, A. Walkenhorst, X. Xi, C. Kwon, Q. Li, S. Bhattacharya, A. Findikoglu, S. Mao, T. Venkatesan, N. Spencer, and W. Grace, "YBCO/SrTiO bilayers for superconducting FET devices by pulsed laser deposition", IEEE Transactions on Applied Superconductivity, 3, pp. 2910–2913 (1992).

A. Dimoulas, J. P. Heida, B. J. v. Wees, T. M. Klapwijk, W. v. d. Graaf and G. Borghs, "Phase–dependent resistance in a superconductor–two–dimensional–electron–gas quasiparticle interferometer", Physical Review Letters, 74, pp. 602–605 (1995).

A. Fiory, A. Hebard, R. Eick, P. Mankiewich, R. Howard, and O'Malley, "Metallic and superconducting surfaces of YBa2Cu3O7 probed by electrostatic charge modulation of epitaxial films", Physical Review Letters, 65, pp. 3441–3444 (1990).

T. Frey, J. Mannhart, J. G. Bednorz, and E. J. Williams, "Mechanism of the electric–field effect in the high–$T_c$ cuprates", Physical Review B, 51, pp. 3257–3260 (1995).

A. K. Geim, S. V. Dubonos, J. G. S. Lok, I. V. Grigorieva, J. C. Maan, L. Theil Hansen, and P. E. Lindelof, "Ballistic Hall micromagnetometry", Applied Physics Letters, 71, pp. 2379–2381 (1997).

S. G. den Hartog, C. M. A. Kapteyn, B. J. van Wees, T. M. Klapwijk, and G. Borghs "Transport in MultiTerminal Normal–Superconductor Devices: Reciprocity Relations, Negative and Nonlocal Resistances and Reentrance of the Proximity Effect", Physical Review Letters, 77, pp. 4954–4957 (1996).

Z. Ivanov, T. Claeson, and T. Andersson, "Three terminal Josephson Junction with a Semiconductor Accumulation Layer", Japanese Journal of Applied Physics, 26 supplement 3, p. 1617 (1987).

Z. G. Ivanov, E. A. Stepantsov, A. Tzalenchuk, R. I. Shekhter, and T. Claeson, "Field Effect Transistor Based On A Bi–Crystal Grain Boundary Josephson Junction", IEEE Transactions on Applied Superconductivity, 3, pp. 2925–2928 (1993).

S. S. James, S. B. Field, J. Seigel, and H. Shtrikman, "Scanning Hall probe microscope images of field penetration into niobium fields", Physica C, 332, pp. 445–449 (2000).

J. Jiang, N. Yoshikawa, X. Y. Han, and M. Sugahara, "New FET using the superconducting phase transition of a high temperature oxide superconductor", Superconductor Science and Technology, 4, pp. 468–470 (1991).

J. R. Kirtley, C. C. Tsuei, M. Rupp, J. Z. Sun, L. S. Yu–Jahnes, A. Gupta, M. B. Ketchen, K. A. Moler, and M. Bhushan, "Direct Imaging of Integer and Half–Integer Josephson Vortices in High–$T_c$ Grain Boundaries", Physical Review Letters, 76, pp. 1336–1339 (1996).

Filomena Lombardi, Z. G. Ivanov, G. M. Fischer, E. Olsson, and T. Claeson,, "Transport and structural properties of the top and bottom grain boundaries in $YBa_2Cu_3O_{7-\delta}$ step–edge Josephson junctions", Applied Physics Letters, 72, pp. 249–251 (1998).

J. Mannhart, B. Mayer, and H. Hilgenkamp, Anomalous dependance of the critical current of 45° grain boundaries in $YBa_2Cu_3O_{7-x}$ on an applied magnetic field, Zeitschrift fur Physik B, 101, pp.175–179 (1996).

J. Mannhart, High–Tc transistors, Superconductor Science and Technology, 9, pp. 49–67 (1996).

J. Mannhart, J. Ströbel, J. G. Bednorz, and Ch. Gerber, "Large electric field effects in YBa2Cu3O7–films containing weak links", Applied Physics Letters, 62, pp. 630–632 (1992).

J. Mannhart, D. G. Schlom, J. G. Bednorz, and K. A. Müller, "Influence of electric fields on pinning in $YBa_2Cu_3O_{7-\delta}$ films", Physical Review Letters, 67, pp. 2099–2101 (1991).

K. Nakajima, K. Yokota, H. Myoren, J. Chen, and T. Yamashita, Field effects on the dielectric property of YBCO bicrystal grain boundary junctions, IEEE Transactions on Applied Superconductivity, 5, pp. 2861–2863 (1995).

Y. Nakamura, Yu. A. Pashkin and J. S. Tsai, "Coherent control of macroscopic quantum states in a single–Cooper–pair box", Nature, 398, pp. 786–788 (1999).

A. Oral, S. J. Bending, R. G. Humphreys, and M. Henini, Microscopic measurement on penetration depth in YBa2Cu3O7–d thin films by scanning Hall probe microscopy, Superconductor Science and Technology, 10, pp. 17–20 (1997).

A. Oral, S. J. Bending, and M. Henini, Real–time scanning Hall Probe microscopy, Applied Physics Letters, 69, pp. 1324–1326 (1996).

Yu. M. Shukrinov, A. Stetsenko, Kh. Nasrulloev, and M. Kohandel, "Tunneling in HTS Junctions", IEEE Transactions of Applied Superconductivity, 8, pp. 142–145.

C. C. Tsuei, J. R. Kirtley, C. C. Chi, Lock See Yu–Jahnes, A. Gupta, T. Shaw, J. Z. Sun, and M. B. Ketchen, "Pairing Symmetry and Flux Quantization in a Tricrystal Superconducting Ring of Yba2Cu3O7–delta", Physical Review Letters, 73, pp. 593–596 (1994).

A. Ya. Tzalenchuk, Z. G. Ivanov, S. V. Dubonos, and T. Claeson, "SQUID and Hall–probe microscopy of superconducting films", IOP Conference Series 167, pp. 581–584 (2000).

C. H. van der Wal, A. C. ter Haar, F. K. Wilhelm, R. N. Schouten, C. J. P. M. Harmans, T. P. Orlando, S. Lloyd, and J. E. Mooij, Quantum Superposition of Macroscopic Persistent–Current States, Science, 290, pp. 773–777 (2000).

X. X. Xi, C. Doughty, A. Walkenhorst, C. Kwon, Q. Li, and T. Venkatesan, Effects of field–induced hole–density modulation on normal–state and superconducting transport in YBa2Cu3O7–x, Physical Review Letters, 68, pp. 1240–1243 (1992).

A. Zagoskin, A scalable, tunable qubit, based on a clean DND or grain boundary D–D junction, Los Alamos National Laboratory preprint cond–mat/9903170, pp. 1–8, (1999), access via http://www.arXiv.org, last accessed Nov. 15, 2002.

* cited by examiner

FOUR-TERMINAL SYSTEM FOR READING THE STATE OF A PHASE QUBIT

CROSS REFERENCE TO RELATED APPLICATION

This application is a divisional of U.S. patent application Ser. No. 09/875,776, filed Jun. 5, 2001, entitled "Four-Terminal System For Reading The State Of A Phase Qubit".

BACKGROUND

1. Field of the Invention

This invention relates to quantum computing and to solid-state devices that use superconductive materials to implement the coherent quantum states used in quantum computing.

2. Description of Related Art

Research on what is now called quantum computing traces back to Richard Feynman. See, e.g., R. P. Feynman, Int. J. Theor. Phys. 21, 467 (1982). He noted that quantum systems are inherently difficult to simulate with classical (i.e., conventional, non-quantum) computers, but that this task could be accomplished by observing the evolution of another quantum system. In particular, solving a theory for the behavior of a quantum system commonly involves solving a differential equation related to the system's Hamiltonian. Observing the behavior of the system provides information regarding the solutions to the equation.

Further efforts in quantum computing were initially concentrated on building the formal theory or on "software development" or extension to other computational problems. Milestones were the discoveries of the Shor and Grover algorithms. See, e.g., P. Shor, SLAM J. of Comput. 26, 1484 (1997); L. Grover, Proc. 28th STOC, 212 (ACM Press, New York, 1996); and A. Kitaev, LANL preprint quant-ph/9511026. In particular, the Shor algorithm permits a quantum computer to factorize large natural numbers efficiently. In this application, a quantum computer could render obsolete all existing "public-key" encryption schemes. In another application, quantum computers (or even a smaller-scale device such as a quantum repeater) could enable absolutely safe communication channels where a message, in principle, cannot be intercepted without being destroyed in the process. See, e.g., H. J. Briegel et al., preprint quant-ph/9803056 and references therein.

Showing that fault-tolerant quantum computation is theoretically possible opened the way for attempts at practical realizations. See, e.g., E. Knill, R. Laflamme, and W. Zurek, Science 279, 342 (1998).

Quantum computing generally involves initializing the states of N qubits (quantum bits), creating controlled entanglements among them, allowing these states to evolve, and reading out the qubits the states evolve. A qubit is conventionally a system having two degenerate (i.e., of equal energy) quantum states, with a non-zero probability of being found in either state. Thus, N qubits can define an initial state that is a combination of $2^N$ classical states. This entangled initial state undergoes an evolution, governed by the interactions that the qubits have among themselves and with external influences. This evolution of the states of N qubits defines a calculation or in effect, $2^N$ simultaneous classical calculations. Reading out the states of the qubits after evolution is complete determines the results of the calculations.

Several physical systems have been proposed for the qubits in a quantum computer. One system uses molecules having degenerate nuclear-spin states. See N. Gershenfeld and I. Chuang, "Method and Apparatus for Quantum Information Processing," U.S. Pat. No. 5,917,322. Nuclear magnetic resonance (NMR) techniques can read the spin states. These systems have successfully implemented a search algorithm, see, e.g., M. Mosca, R. H. Hansen, and J. A. Jones, "Implementation of a quantum search algorithm on a quantum computer," Nature 393, 344 (1998) and references therein, and a number-ordering algorithm, see, e.g., L. M. K. Vandersypen, M. Steffen, G. Breyta, C. S. Yannoni, R. Cleve, and I. L. Chuang, "Experimental realization of order-finding with a quantum computer," preprint quant-ph/0007017 and references therein. (The number-ordering algorithm is related to the quantum Fourier transform, an essential element of both Shor's factoring algorithm and Grover's algorithm for searching unsorted databases.) However, expanding such systems to a commercially useful number of qubits is difficult.

More generally, many of the current proposals will not scale up from a few qubits to the $10^2$–$10^3$ qubits needed for most practical calculations. A technology that is excellently suited for large-scale integration involves superconducting phase qubits.

One implementation of a phase qubit involves a micrometer-sized loop with three (or four) Josephson junctions. See J. E. Mooij, T. P. Orlando, L. Levitov, L. Tian, C. H. van der Wal, and S. Lloyd, "Josephson Persistent-Current Qubit," Science 285, 1036 (1999) and references therein. The energy levels of this system correspond to differing amounts of magnetic flux threading the loop. Application of a static magnetic field normal to the loop may bring two of these energy levels (or basis states) into degeneracy. Typically, external AC electromagnetic fields are also applied, to enable tunneling between non-degenerate states.

A radio-frequency superconducting quantum-interference device (rf-SQUID) qubit is another type of phase qubit having a state that can be read by inductively coupling the rf-SQUID to rapid single-flux-quantum (RSFQ) circuitry. See R. C. Rey-de-Castro, M. F. Bocko, A. M. Herr, C. A. Mancini, and M. J. Feldman, "Design of an RSFQ Control Circuit to Observe MQC on an rf-SQUID," IEEE Trans. Appl. Supercond. 11, 1014 (2001) and references therein, which is hereby incorporated by reference in its entirety. A timer controls the readout circuitry and triggers the entire process with a single input pulse, producing an output pulse only for one of the two possible final qubit states. The risk of this readout method lies in the inductive coupling with the environment causing decoherence or disturbance of the qubit state during quantum evolution. The circuitry attempts to reduce decoherence by isolating the qubit with intermediate inductive loops. Although this may be effective, the overhead is large, and the method becomes clumsy for large numbers of qubits.

In both above systems, an additional problem is the use of basis states that are not naturally degenerate. Accordingly, the strength of the biasing field for each qubit has to be precisely controlled to achieve the desired tunneling between its basis states. This is possible for one qubit, but becomes extremely difficult with several qubits.

U.S. patent applications Ser. No. 09/452,749, "Permanent Readout Superconducting Qubit," filed Dec. 1, 1999, and Ser. No. 09/479,336, "Qubit using a Josephson Junction between s-Wave and d-Wave Superconductors," filed Jan. 7, 2000, which are hereby incorporated by reference in their entirety, describe Permanent Readout Superconducting Qubits (PRSQs). An exemplary PRSQ consists of a bulk superconductor, a grain boundary, a superconductive mesoscopic island [i.e., a superconductive region having a size such that a single excess Cooper pair (pair of electrons) is noticeable], and a means for grounding the island. The material used in the bulk or the island has a superconducting order containing a dominant component whose pairing symmetry has non-zero angular momentum, and a sub-dominant component with any pairing symmetry. As a result, the qubit has the states $\pm\Phi_0$, where $\Phi_0$ is the minimum-energy phase of the island with respect to the bulk superconductor.

The area in which the phase is maintained is much more localized in a PRSQ than in prior qubits such as an rf-SQUID qubit. Thus, the rate of decoherence is minimized, making the PRSQ a strong candidate for future solid-state quantum-computing implementations.

The state of a PRSQ can be characterized by the direction of the magnetic field, H↑ or H↓, inside the junction between the bulk and the island. This difference in field direction can be used to read out the state of a PRSQ, for instance using a SQUID. However, the proposed readout methods introduce an interaction with the environment that potentially disturbs the state of the qubit, which necessitates complicated and time-consuming error-correction and/or re-initialization procedures. Attempts to "switch off" the readout circuit during quantum evolution face severe practical constraints. For example, physically manipulating the distance between the SQUID and qubit prior to readout could provide the desired coupling and decoupling but is complex to implement, while up to the present, no integrated solid-state alternative method is known.

The issues discussed above for rf-SQUID qubits and PRSQs are general. Also, other currently proposed methods for reading out the state of a phase qubit involve detection and manipulation of magnetic fields, which make these methods susceptible to decohering noise and limit the overall scalability of the device. Thus, there is a need for an efficient readout method that is non-destructive and switchable, i.e., that does not couple the qubit to the environment during computations.

Our invention invokes the classical Hall effect, which arises from the tangential acceleration of moving charged particles in an external magnetic field perpendicular to the velocity of the charged particles. The Hall effect drives oppositely charged particles in opposite directions and leading to charge build-up on the surfaces. As a result, current flow through a sample in a magnetic field produces a Hall voltage across the sample, in the direction perpendicular to both the current and the field. The Hall effect can be observed in a sample that is a conductor or a semiconductor, in which case the charged particles are the electrons or holes.

The Hall effect can also exist in superconducting structures. For SNS (superconductor-normal conductor-superconductor) junctions, the Hall effect was theoretically described by F. Zhou and B. Spivak in "Hall Effect in SN and SNS Junctions," Phys. Rev. Lett. 80, 3847 (1998); for a related effect, see A. Furusaki, M. Matsumoto, and M. Sigrist, "Spontaneous Hall effect in chiral p-wave superconductor," preprint cond-mat/0102143 and references therein. Both articles are hereby incorporated by reference in their entirety.

SUMMARY

In accordance with an aspect of the invention, a phase-qubit device such as a PRSQ uses a four-terminal readout method and system. One embodiment includes an insulator over the qubit and conducting electrodes (which can be metallic) over the insulator (or two insulators over the qubit with an electrode over each insulator) to create two extra tunnel junctions across the width of the qubit. A readout process then involves grounding the PRSQ island, applying a current bias through the qubit, and measuring the potential drop across the electrodes.

The above embodiment of the invention can take advantage of the Hall effect to measure the magnetic field inside the junction. The current bias perpendicular to the junction (from bulk to island for example) can be a pulse. Given the direction of the bias current, the sign of the time-averaged Hall voltage read out across the width of the junction indicates the orientation of the magnetic field, i.e., the state of the qubit. In other words, for a given bias current, the expected voltage is positive or negative depending on the qubit state (H↑ or H↓).

Before reading out the qubit state, the qubit island is grounded for the application of the bias current through the qubit. The grounding operation strongly increases the island capacitance of the island, thus "freezing" the qubit by suppressing tunneling and other quantum effects. Thus, while the grounding connection is closed, the qubit retains the same state. In an embodiment of the invention, the grounding circuitry includes a switch such as a single-electron transistor (SET) or parity key. By modulating the gate voltage on the SET (or the flux through the parity key), the circuit can be opened and closed The SET can operate with either single electrons or Cooper pairs, depending on the embodiment of the invention.

In one embodiment of the invention, the Josephson junction in the qubit is an SNS structure, in which case the Hall voltage in the normal-conductor barrier consists of short pulses with a non-zero time average. More generally, readout processes using the Hall effect are applicable to any type of Josephson junction including, for example, grain-boundary junctions.

In an embodiment of the invention, the resistance of the tunnel barrier that isolates the qubit from an electrode in the readout system is chosen so as to allow for voltage measurements without introducing a large, intrusive noise in the qubit. Typically, the tunnel resistance is of the order of 100 k$\Omega$.

Alternative embodiments of the invention can place the electrodes symmetrically or asymmetrically over the junction. Asymmetric placement further allows for the readout of a dipole magnetic field inside the junction, with the Hall electrodes being predominantly sensitive to one dipole component.

The four-terminal readout process does not introduce a strong coupling to the environment and is compatible with the qubit schematics. Additionally, fabrication techniques permit formation of the readout system as part of an integrated structure that can be scaled to include a large number of qubits.

DETAILED DESCRIPTION

Figure 1A:
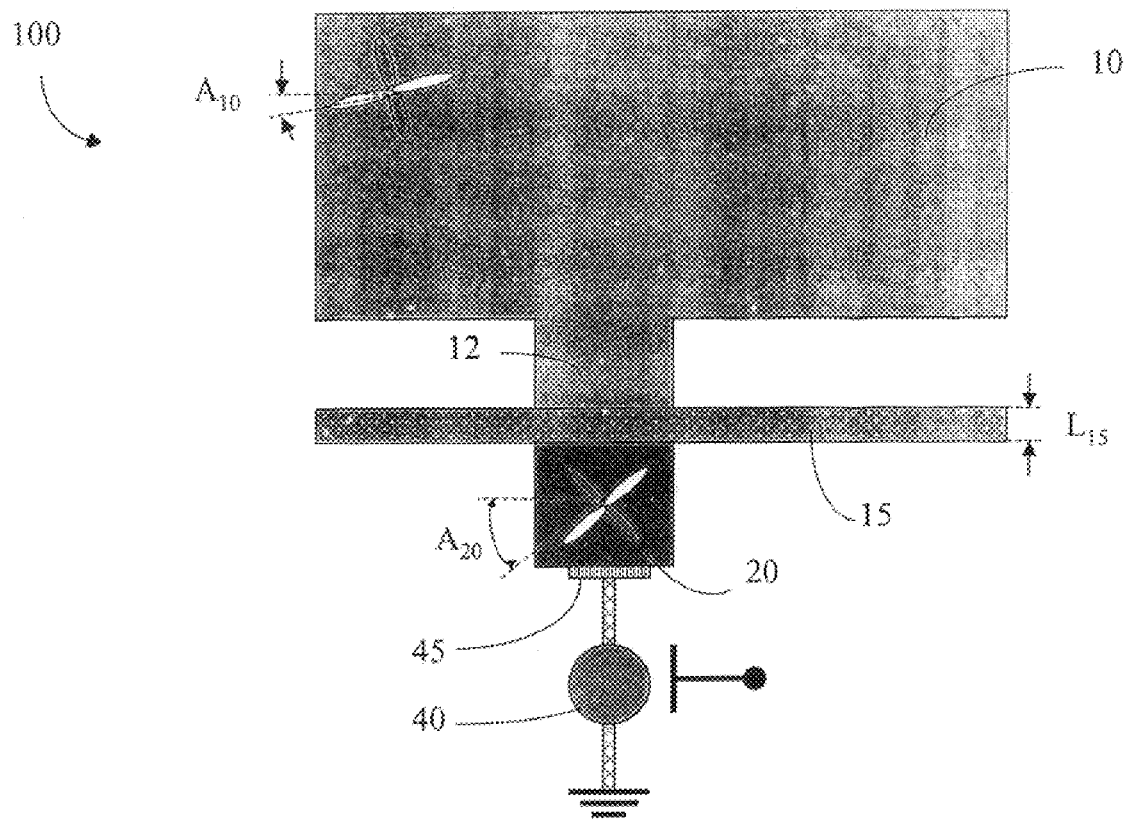
FIGS. 1A, 1B, and 1C illustrate a fabrication process for the readout system for a Permanent Readout Superconducting Qubit (PRSQ).

In accordance with an aspect of the invention, a system and process read out the state of a qubit including at least one Josephson junction and having states corresponding to degenerate ground states of different magnetic moments. Such a readout system can include a grounding mechanism, a mechanism for biasing the qubit junction with current pulses, and a mechanism for determining the potential drop across the width of the junction. Given the direction of the bias current, the orientation of the state-dependent magnetic field controls the sign of the measured potential drop. In other words, for a given bias current, a positive or negative measured voltage corresponds to the qubit state (H↑ or H↓). The readout process can be non-destructive to the qubit state as long as the applied bias remains below a de-pinning current, which depends upon the embodiment of the invention.

For example, if the threshold current of a PRSQ is exceeded, then the flux of the qubit, which defines its state and under normal operation is localized in the two degenerate ground states, becomes de-pinned, and dynamical effects result. The de-pinning current of the qubit is correlated with such aspects as the junction thickness, or the crystal misalignment between the island and bulk superconductors. Moreover, the de-pinning current can also depend on the qubit state.

In one embodiment, the bias current is less than the de-pinning current, which has a magnitude that is specific to the qubit structure and can be determined for each system. In another embodiment of the invention, the bias current can exceed the de-pinning current, thus erasing the qubit state.

In an embodiment of the invention that applies the four-terminal readout to a Josephson grain-boundary-junction phase qubit (PRSQ), a mechanism for measuring the potential drop across the qubit junction can include two conductive electrodes separated from each other along the grain boundary and isolated from the qubit by a high-resistance insulator. The two electrodes can be connected to a voltmeter that can detect the magnitude and direction of a potential difference between the electrodes. The resistance of the insulator depends on the embodiment of the invention, but should be chosen to minimize the electrode-qubit coupling during evolution of the qubit's state.

The electrodes can overlie opposite edges of the Josephson junction with a high-resistance insulator between the Josephson junction and the electrodes. A device such as a voltmeter, which can be an electrometer, detects the sign of a potential difference between the electrodes during readout.

One method for four-terminal readout in accordance with the invention grounds the superconducting island so that a bias current can flow through the qubit to ground. A bias current is then applied through the Josephson junction by way of connecting a current source in series with the qubit. The current source can be connected to the bulk superconductor and ground. The force that the qubit's magnetic field H exerts on the current through the Josephson junction creates a Hall electric field across the width of the current flow. The electrodes, which are capacitively coupled through high-resistance barriers to the Josephson junction, develop a voltage difference, reflecting the direction and magnitude of the magnetic field H.

Figure 1B:
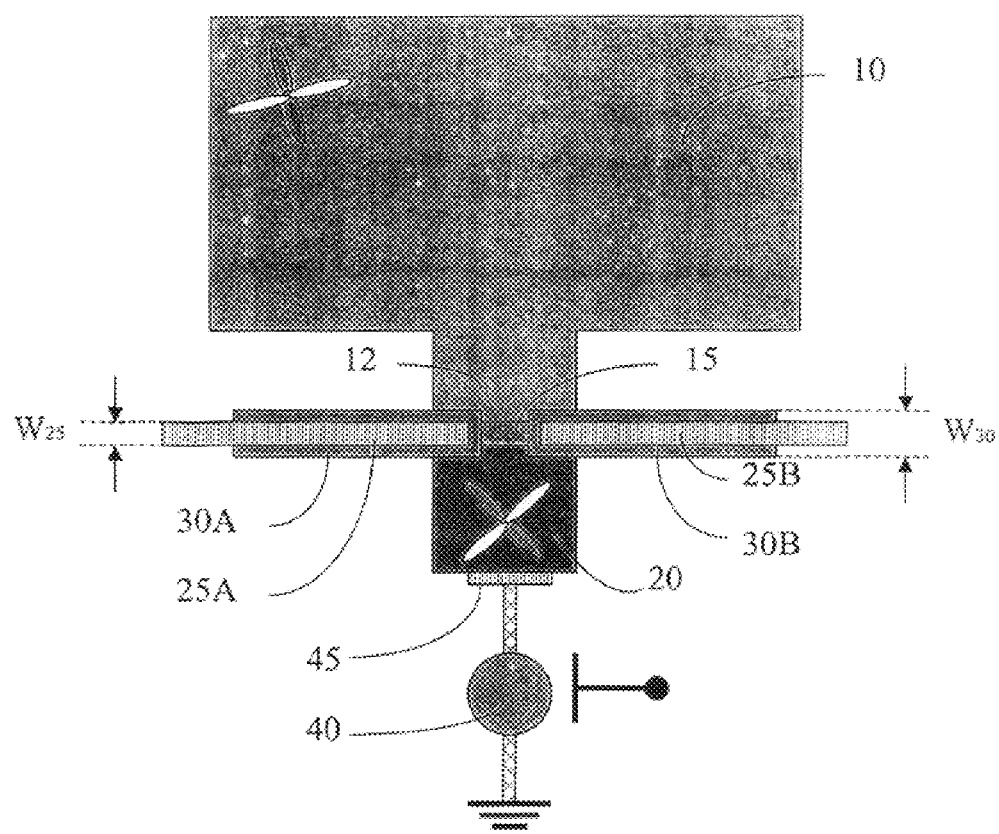
Figure 1C:
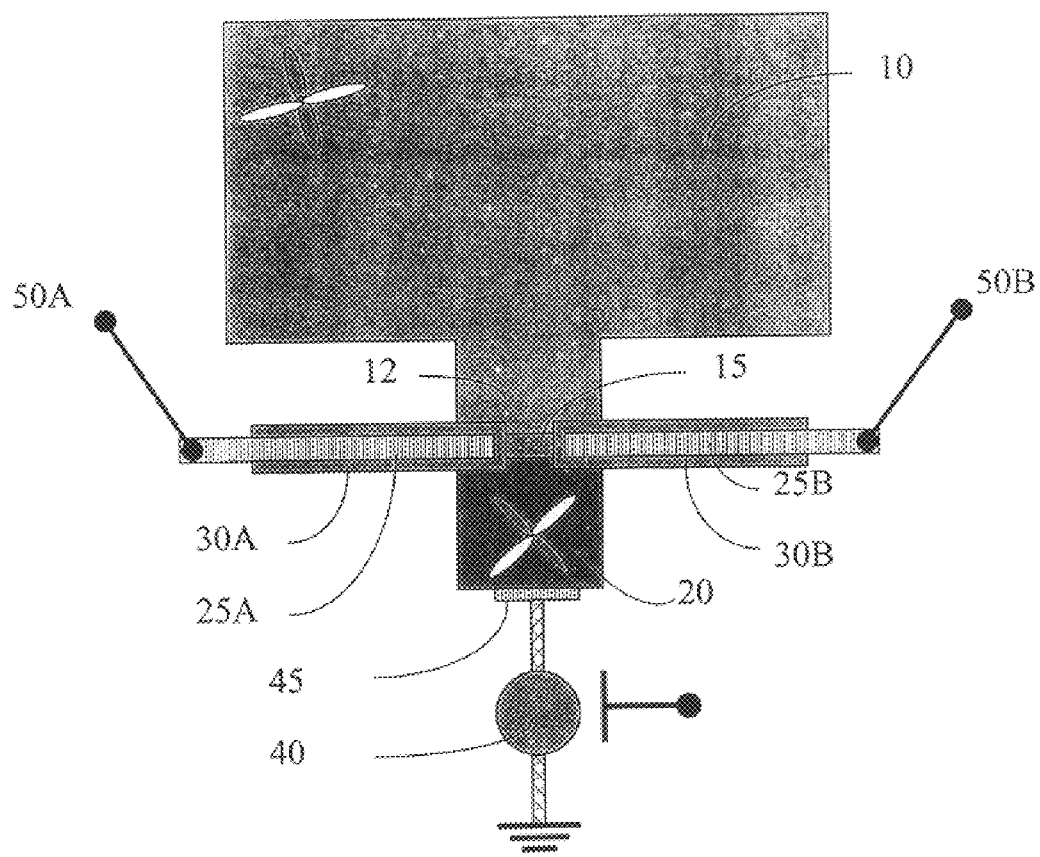

FIGS. 1A, 1B, and 1C illustrate in plan view a process for fabricating a PRSQ with a four-terminal readout structure in accordance with an embodiment of the invention. FIG. 1A shows a structure 100 including a bulk superconductor 10, a mesoscopic superconducting island 20, and a junction material 15 between bulk 10 and island 20 to form a Josephson junction. Fabrication of a structure such as illustrated in FIG. 1A is further described in U.S. patent application Ser. No. 09/452,749, which is incorporated by reference above. The crystal alignments of bulk 10 and island 20 can have misorientation angles $A_{10}$ and $A_{20}$ respectively, with respect to the junction interface. These misorientation angles affect the properties of the qubit associated with the Josephson junction. For example, if angle $A_{10}$ is zero and angle $A_{20}$ is 45°, the critical current of the junction will be maximized.

In one embodiment, bulk 10 is a region of superconducting material (e.g., YBCO or $YBa_2Cu_3O_{7-x}$) that has a pairing symmetry having non-zero angular momentum and is formed with a thickness on the order of 100 nm on an underlying insulating substrate (not shown). An optional finger 12, which is part of bulk superconductor 10, extends toward island 20. Bulk 10 is large enough to have a fixed phase, with respect to which island 20 has a bi-stable ground-state phase of $\pm\Phi_0$. These two ground states make up the basis states of the PRSQ.

Mesoscopic island 20 is a region of superconducting material (e.g., YBCO) having a dominant pairing symmetry with non-zero angular momentum, formed on the substrate to about the same thickness as bulk superconductor 10. The dimensions of island 20 are typically on the order of 1 $\mu$m by 1 $\mu$m. The width of island 20 controls the width of the Josephson junction and can be less than or equal to the width of finger 12.

For a qubit containing an extrinsic Josephson junction, junction material 15 is typically a normal metal such as gold (Au) and has a thickness $L_{15}$ chosen to optimize the critical current. Alternatively, junction material 15 can be a grain boundary between bulk 10 and island 20.

A mechanism 40 for grounding the qubit can include any switch that can effect a connection between the qubit and ground. Use of a SET for grounding island 20 was first described in U.S. patent application Ser. No. 09/452,749, incorporated by reference above. The use of SETs is well known and operation is well established.

As illustrated in FIG. 1B, the fabrication process adds high-resistance insulators 30A and 30B and electrodes 25A and 25B over the junction of the qubit. Each insulator 30A or 30B forms a tunnel barrier and can be, for example, a region of a high-temperature superconductor (HTS) material such as YBCO doped or chemically treated to be in the insulating state. Alternatively, for an extrinsic Josephson junction, such as gold in YBCO/Au/YBCO junction, insulators 30A and 30B can be formed, for example, by depositing, patterning, and oxidizing a thin layer of aluminum (Al). Each of insulators 30A and 30B has a width $W_{30}$, which is typically the order of 10 to 20 nm. As an alternative to the two separate insulators 30A and 30B illustrated in FIG. 1B, one insulator can extend across the entire width of the junction.

Electrodes 25A and 25B, which are on respective insulating region 30A and 30B, are conducting regions and can be made of a metal such as gold or a semiconductor such as (doped) gallium-arsenide. Electrodes 25A and 25B can be formed using conventional deposition and photolithography techniques.

FIG. 1B shows insulating regions 30A and 30B and electrodes 25A and 25B positions relative to junction material 15. Alternatively, regions 30A and 30B and/or electrodes 25A and 25B can be placed asymmetrically with respect to the center of the junction, e.g., extending further over bulk 10 or further over island 20. Asymmetric placement of electrodes 25A and 25B facilitates readout of dipolar magnetic fields in the junction by positioning electrodes 25A and 25B to be mostly affected by the Hall effect voltage that one pole of the magnetic field causes.

A readout method for a phase qubit such as illustrated in FIG. 1C includes: grounding island 20 to allow current flow through the qubit, applying a current through the Josephson junction (from bulk 10 to island 20 or from island 20 to bulk 10), reading the resulting potential difference between terminals 50A and 50B connected to electrodes 25A and 25B, and identifying the state of the qubit from the measured voltage difference. Generally, the magnitude of the voltage difference depends on the particular structure of the qubit, but the sign of the voltage difference depends solely on the directions of the bias current and the qubit magnetic moment.

Figure 2:
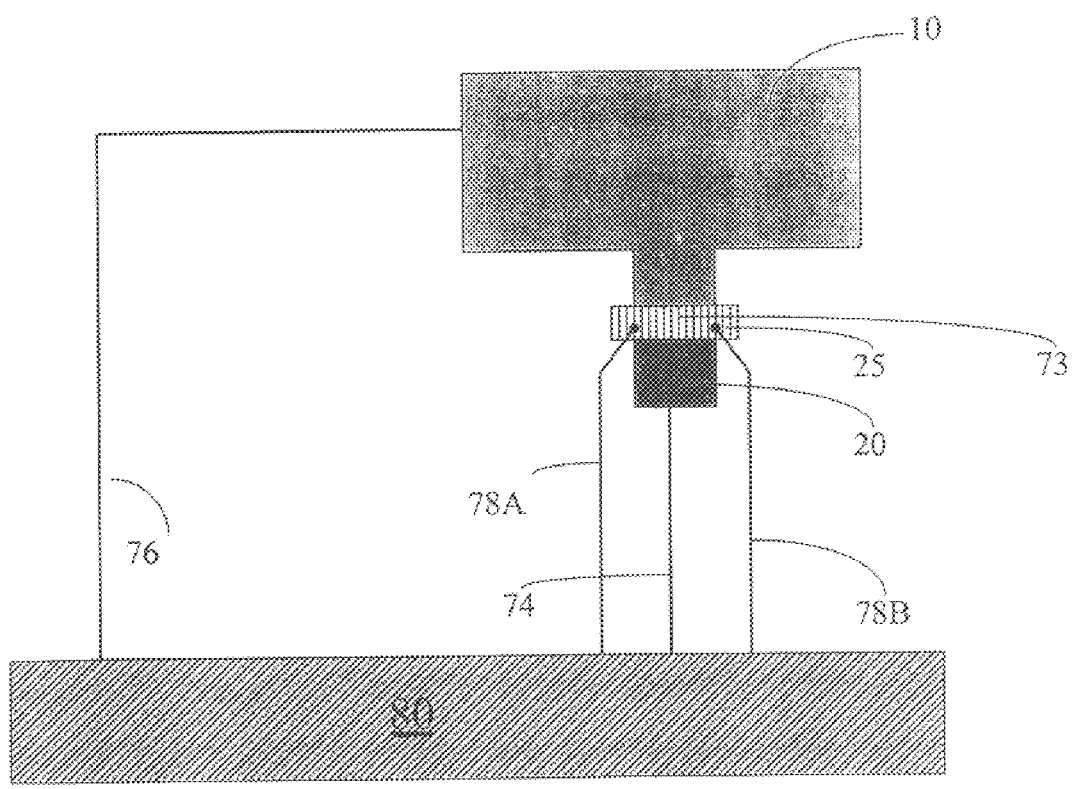
FIG. 2 is a block diagram illustrating a control system integrated with the four-terminal readout system.

FIG. 2 illustrates a quantum computing system including a qubit and a control system 80 for reading the state of the magnetic moment of the qubit. Control system 80 generally provides external control of the readout of the qubit and includes: a mechanism for applying a current source or supercurrent source to the Josephson junction, a mechanism for grounding the qubit, and a voltmeter. The control system interfaces with the four terminals 74, 76, 78A, and 78B of the readout system. More particularly, control system 80 uses terminal 74 for grounding island 20. In an embodiment, terminal 74 connects to the gate of a SET that is between island 20 and ground, and during the readout operation, control system 80 controls the gate voltage to cause the SET to conduct. Terminal 76 is connected to bulk superconductor 10, and control system 80 temporarily applies a bias voltage or current source to bulk 10 to cause a current through the Josephson junction between bulk 10 and island 20. Terminals 78A and 78B correspond to terminals 50A and 50B (FIG. 1C) and connect a voltmeter or other measurement device in control system 80 to the electrodes over the Josephson junction for measuring a voltage difference during the readout operation.

An electrode structure 73 of the readout system of FIG. 2 can include an insulative region and conductive region, wherein the conductive region is deposited on the insulative region. Electrode system 73 is part of the readout system and allows measurement of the potential drop across the width of the qubit.

Figure 3:
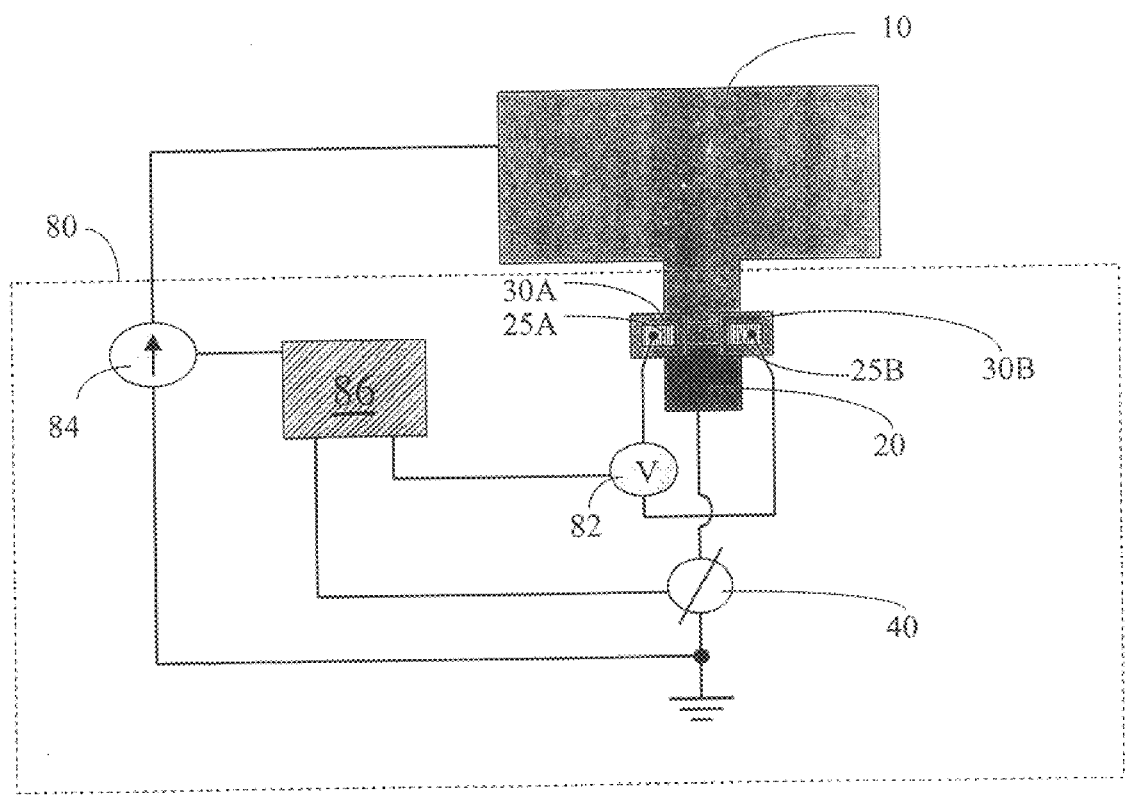
FIG. 3 illustrates a control system as an integrated circuit for the four-terminal readout system.

FIG. 3 illustrates an exemplary embodiment of the circuitry in control system 80. In the illustrated embodiment, control system 80 includes read logic 86, a switch 40, a current source 84, and a voltmeter 82. For a readout operation, read logic 86 operates switch 40 to directly connect island 20 to ground. Switch 40 can be a SET, a parity key, or another device capable of grounding island 20. Read logic 86 then temporarily connects current source 84 to bulk superconductor 10 to generate a current through the junction between bulk superconductor 10 and island 20. The magnetic field at the junction creates a voltage difference across the current flow. Electrodes 25A and 25B, which are along the Josephson junction between bulk superconductor 10 and island 20, are capacitively coupled to the voltage across the current flow, and the change in the voltage across the current flow generates a corresponding voltage difference between electrodes 25A and 25B. Voltmeter 82, which is connects electrodes 25A and 25B, measures any potential difference between electrodes 25A and 25B.

In some embodiments of the invention such as illustrated in FIG. 3, read logic 86 and current source 84 produce a current pulse train with a tunable frequency. In such embodiments, voltmeter 82 can be a radio-frequency single-electron transistor (rf-SET), with capability of detecting microvolt—picosecond voltages. Operation of rf-SETs is well known; see, e.g., R. J. Schoelkopf, P. Wahlgren, A. A. Kozhevnikov, P. Delsing, and D. E. Prober, "The Radio-Frequency Single-Electron Transistor (rf-SET): A Fast and Ultrasensitive Electrometer," Science 280, 1238 (1998).

An embodiment of a method for reading out the states of multiple qubits can include readout of one qubit at a time by grounding a selected qubit, applying a current through the Josephson junction associated with the selected qubit, and measuring the voltage difference in the electrode system associated with the selected qubit. The process is repeated for each qubit where the only difference is modulation of the grounding switches on each qubit. Reading one qubit at a time, the respective grounding switch is closed, while the other grounding switches remain open, thus allowing only a single path for the current to travel along.

Figure 4:
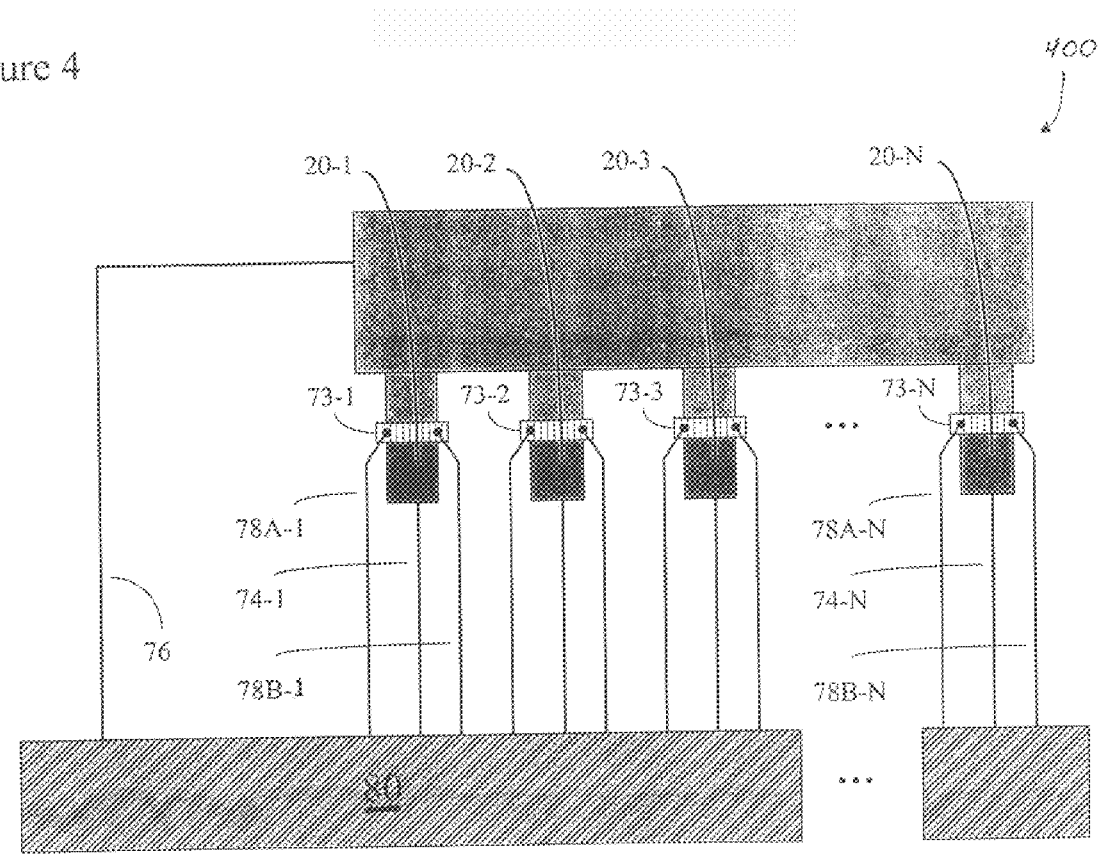
FIG. 4 illustrates a multi-qubit system with a readout control system and a pair of electrodes for each qubit.

FIG. 4 illustrates a control system 80 in a multi-qubit system 400. In multi-qubit system 400, a terminal 76 connects to bulk superconductor 10 for applying a current source 84 through bulk superconductor 10. Terminals 74-1 to 74-N provide a mechanism for grounding respective islands 20-1 to 20-N. Additionally, each qubit 1 to N has a pair of terminals 78A-1 and 78B-1 to 78A-N and 78B-N for measuring the potential drop across readout system 73-1 to 73-N, respectively.

In an embodiment of the invention, selection and read logic selects which of the qubits is being read and connects the selected qubit to a voltmeter. Selection logic then grounds the selected qubit and activates a current source to drive one or more current pulses between bulk superconductor 10 and the island 20 of the selected qubit. The current pulses can have a period on the order of one or more picoseconds. The voltmeter, which can be a DC voltmeter, measures a time-average of the voltage drop that the picosecond pulses cause. Thermal excitations in the qubit can cause fluctuation in the measured potential difference. Thus, at low enough temperatures (less than 1 K), the effects of thermal fluctuations will be minimized, and the voltmeter can integrate the signal infinitely long. The voltmeter generally requires detection sensitivity on the order of microvolts, given the noise due to the high-resistance barrier.

As noted above, each qubit has a switch such as a SET between the associated island 20 and ground. When the switch is closed, the qubit is grounded and the wavefunction collapses, thus fixing the state of the qubit and allowing a current to flow through the qubit. The current source, which is in series to ground and the bulk superconductor, applies the current pulses through the grounded qubit to create a potential drop to which the electrode system on the respective qubit responds. The measured potential drop indicates the magnetic moment state of the selected qubit.

Figure 5:
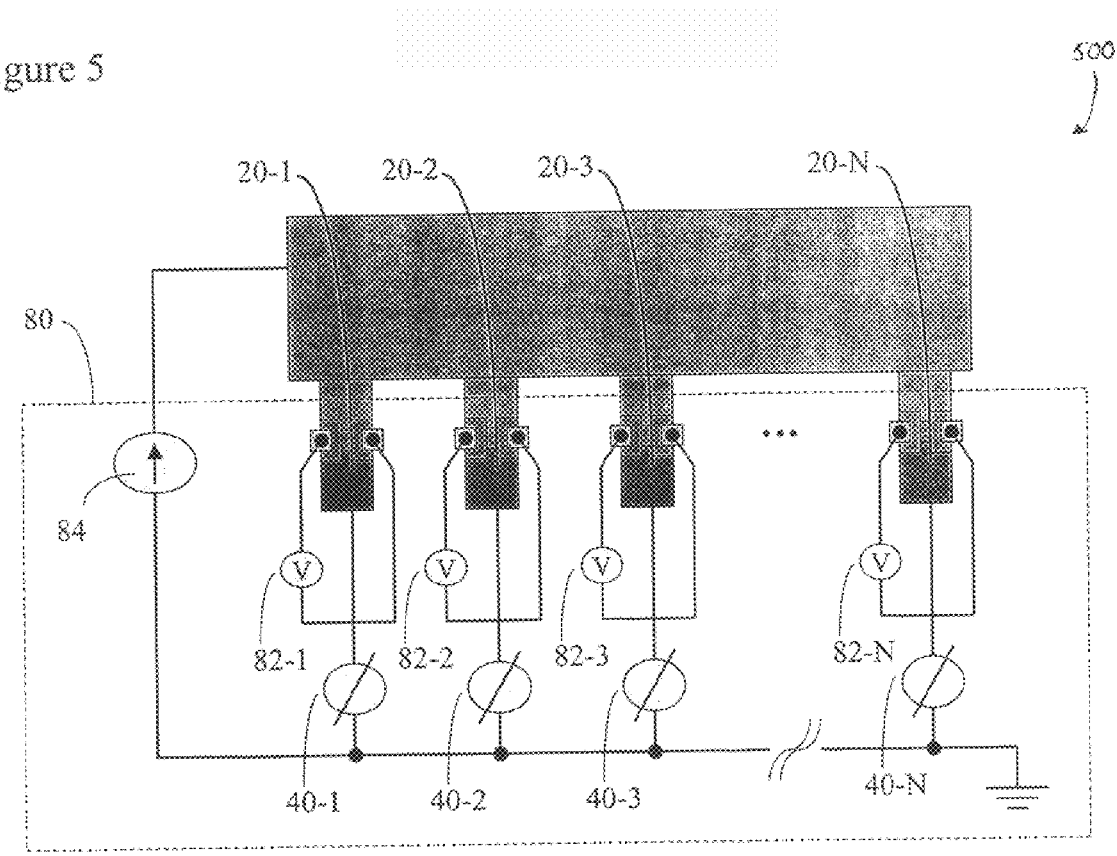
FIG. 5 illustrates a control system as an integrated circuit for a multi-qubit system.

FIG. 5 illustrates an embodiment of control system 80 in a multi-qubit system 500. In the embodiment of FIG. 5, each qubit is read out in turn, but the evolution of the qubit system, e.g., the oscillation frequency of each isolated qubit between its two states, will continue after the start of the readout process. However, each qubit that further evolves after completion of the calculation will return to the desired state after some period of time t that can be determined for the qubit. A method for reading out the state of the qubit system, thus can ground a first qubit, apply a current across the first qubit, measure the potential drop across the width of the first qubit, and wait the time t (from the start of the readout on the first qubit) before repeating the method for a next qubit.

FIG. 5 illustrates an embodiment of a control system for a multi-qubit system 500. Control system 80 includes readout logic, which is not shown but is used to control the state of each of the devices in control system 80, a single current source 84, grounding switches 40-1 to 40-N for respective qubits 1 to N, voltmeters 82-1 to 82-N for respective qubits 1 to N, and electrode structures on the junctions of the qubits. In accordance with an aspect of the invention, one method for readout of the state of the multi-qubit system 500 grounds a first qubit by closing the respective switch 40, and applies a current from the current source 84 to the bulk of the multi-qubit system 500. Given that a single qubit is grounded, the current flows through just the grounded qubit, resulting in a voltage drop across the readout structure placed over the junction. The respective voltmeter 82 can measure the voltage to determine the state of the grounded qubit. The process can then be repeated for the remainder of the qubits in the system. In an embodiment of the readout method, only the states of specific qubits are readout, while the others continue to evolve.

Figure 6:
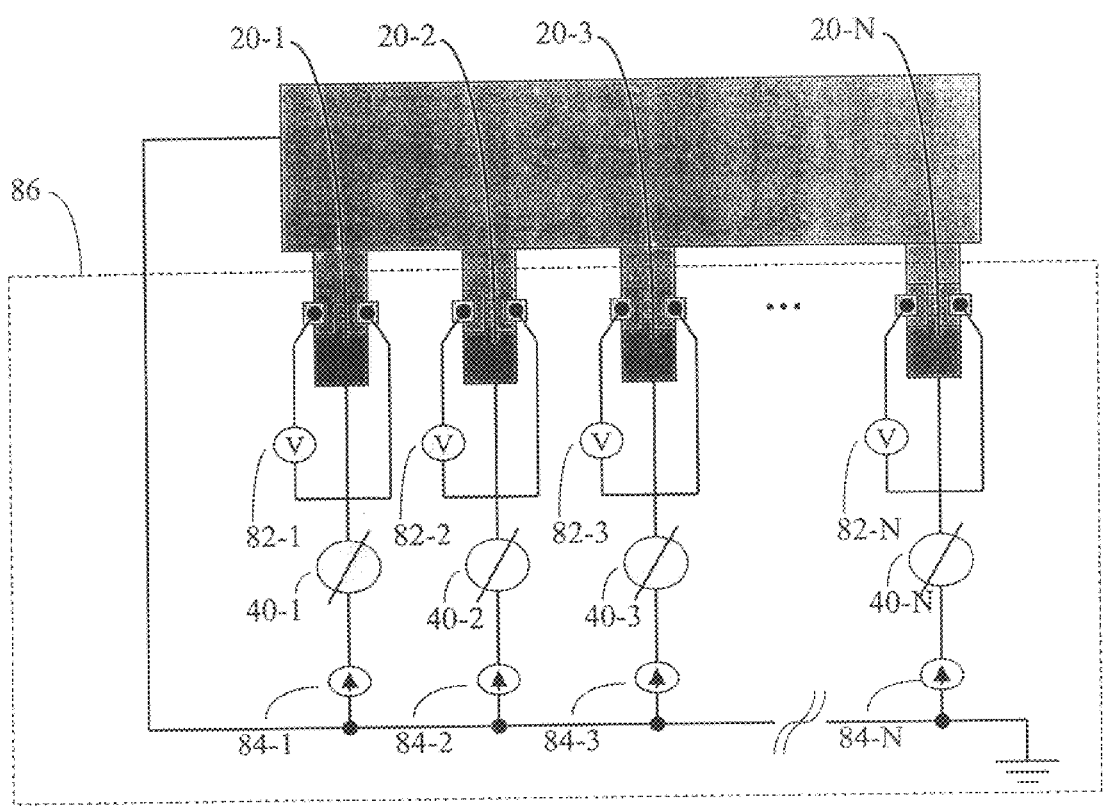
FIG. 6 illustrates a control system as another integrated circuit for a multi-qubit system.

FIG. 6 illustrates an embodiment of the control system for a qubit system 600 that includes a plurality of qubits and a control system 86 for reading the states of the qubits. Control system 86 includes current source 84-1 through 84-N connected to islands 20-1 through 20-N, respectively in qubits 1 to N. Other than having a separate current source for each qubit aspects of control system 86 are as described above in regard to FIG. 5. However, a readout method for qubit system 600 can include simultaneous readout of several or all of the qubits. In an embodiment of the readout method, qubits in the multi-qubit system 600 are grounded, and respective current sources 84-1 to 84-N drive a current through the respective qubits. Potential drops can be measured in the readout structure on the respective qubits. Control system 86 includes readout logic for controlling each of the control system readout components. In another embodiment of the readout method for the control system of FIG. 6, the state of a qubit can be determined independently of the entire register using the method as described above.

Figure 7:
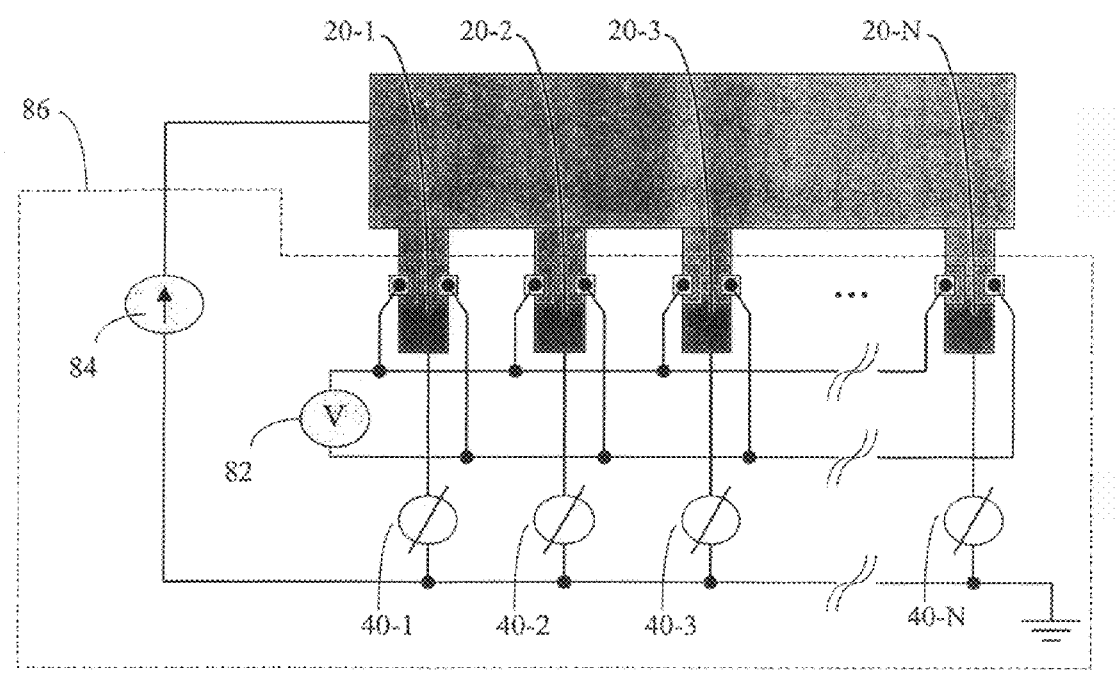
FIG. 7 illustrates a control system as an integrated circuit for a multi-qubit system.

FIG. 7 illustrates an embodiment of the invention, wherein control system 86 has a single voltmeter 82 for all of the qubits. In this embodiment, voltmeter 82 can measure the potential drop across the selected qubit, but each qubit must be read out individually. The separate readout operations for the individual qubits are timed according to the calculated time t for the qubits to return to the desired state.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A method for reading out a state of a qubit, comprising:

grounding the qubit;

applying a current through the qubit;

measuring a voltage across the current; and determining the state of the qubit from the voltage measured.

2. The method of claim 1, wherein measuring the voltage comprises measuring voltage between two separate electrodes that overlie opposite sides of the qubit.

3. The method of claim 1, wherein applying the current comprises applying current pulses through the qubit.

4. The method of claim 3, wherein the current pulses have a period less than 10 picosecond.

5. The method of claim 3, wherein measuring the voltage comprises using a DC voltmeter to determine a time average of the voltage.

6. The method of claim 1, wherein the qubit comprises a first superconducting region and a second superconducting region separated by a junction.

7. The method of claim 6, wherein measuring the voltage comprises measuring voltage between two separate electrodes, each of which overlies the junction.

8. The method of claim 6, wherein the current flows through the junction.

9. The method of claim 1, wherein the qubit is a phase qubit.

10. The method of claim 9, wherein the phase qubit is associated with a junction between a bulk superconductor and a superconducting island, and applying the current through the qubit comprises connecting a current source in series with a bulk superconductor, the superconducting island, and ground.

11. The method of claim 10, wherein the current source is a supercurrent source.

12. The method of claim 10, wherein applying a current includes applying a potential difference across the qubit with respect to ground.

13. The method of claim 1, wherein the qubit is a permanent readout superconducting qubit.

* * * * *